(12) United States Patent
Yamanaka et al.

(10) Patent No.: US 8,729,677 B2
(45) Date of Patent: May 20, 2014

(54) SEMICONDUCTOR SUBSTRATE, ELECTRONIC DEVICE AND METHOD FOR MANUFACTURING SEMICONDUCTOR SUBSTRATE

(75) Inventors: Sadanori Yamanaka, Chiba (JP); Masahiko Hata, Tsuchiura (JP); Tomoyuki Takada, Tsukuba (JP)

(73) Assignee: Sumitomo Chemical Company, Limited, Tokyo (JP)

(*) Notice: Subject to any disclaimer, the term of this patent is extended or adjusted under 35 U.S.C. 154(b) by 121 days.

(21) Appl. No.: 13/131,498

(22) PCT Filed: Nov. 26, 2009

(86) PCT No.: PCT/JP2009/006404
§ 371 (c)(1),
(2), (4) Date: May 26, 2011

(87) PCT Pub. No.: WO2010/061616
PCT Pub. Date: Jun. 3, 2010

(65) Prior Publication Data
US 2011/0227129 A1    Sep. 22, 2011

(30) Foreign Application Priority Data
Nov. 28, 2008    (JP) .................... 2008-305415

(51) Int. Cl.
*H01L 29/04*    (2006.01)

(52) U.S. Cl.
USPC .................... 257/632; 257/E21.122

(58) Field of Classification Search
USPC .......................... 257/632, E21.122
See application file for complete search history.

(56) References Cited

U.S. PATENT DOCUMENTS

| | | |
|---|---|---|
| 4,614,564 A | 9/1986 | Sheldon et al. |
| 5,221,413 A | 6/1993 | Brasen et al. |
| 5,442,205 A | 8/1995 | Brasen et al. |

FOREIGN PATENT DOCUMENTS

| | | |
|---|---|---|
| JP | 61-135115 A | 6/1986 |
| JP | 1-120013 A | 5/1989 |
| JP | 4-084418 A | 3/1992 |
| JP | 4-233720 A | 8/1992 |
| JP | 6-188478 A | 7/1994 |
| JP | 6-208963 A | 7/1994 |
| JP | 6-252046 A | 9/1994 |
| JP | 8-321444 A | 12/1996 |
| JP | 2000-223420 A | 8/2000 |
| JP | 2004-281869 A | 10/2004 |

OTHER PUBLICATIONS

Machine Translation of JP 2000-223420.*
International Preliminary Report on Patentability dated Jul. 5, 2011 for International application No. PCT/JP2009/006404.
Hoon Jung Oh, et al., "Integration of GaAs epitaxial layer to Si-based substrate using Ge condensation and low-temperature migration enhanced epitaxy techniques", Journal of Applied Physics, 2007, pp. 054306-1 to 054306-6, vol. 102, No. 5.
Japanese Office Action issued in counterpart JP Application No. 2009-269918, dated Nov. 26, 2013.

* cited by examiner

*Primary Examiner* — Amar Movva
(74) *Attorney, Agent, or Firm* — Sughrue Mion, PLLC

(57) ABSTRACT

A semiconductor wafer including: a base wafer; a seed crystal disposed on the base wafer; a compound semiconductor disposed above the seed crystal; and a high resistance layer disposed between the seed crystal and the compound semiconductor, the high resistance layer having a larger resistivity than the seed crystal, and the seed crystal lattice matching or pseudo lattice matching the compound semiconductor is provided.

18 Claims, 15 Drawing Sheets

SEMICONDUCTOR SUBSTRATE, ELECTRONIC DEVICE AND METHOD FOR MANUFACTURING SEMICONDUCTOR SUBSTRATE

TECHNICAL FIELD

The present invention relates to a semiconductor wafer, an electronic device, and a method of manufacturing a semiconductor wafer.

BACKGROUND ART

Recently, various types of high-function electronic devices using a compound semiconductor such as GaAs in an active region have been developed. Crystallinity of the compound semiconductor has a great impact on the performance of the electronic device, and so it is required to form a compound semiconductor having superior crystallinity. For example, Patent Document 1 discloses a semiconductor device including GaAs having a low defect density grown on the silicon wafer.

In Patent Document 1, a silicon oxide layer is formed on a silicon wafer, and a germanium-silicon alloy is formed inside an opening having been disposed in the silicon oxide layer. As a result, a germanium plane having an extremely small dislocation defect density is formed on the germanium-silicon alloy. GaAs grown on the germanium plane has a small defect density. In Patent Document 1, the semiconductor device is formed by coupling the light emitting element and the light receiving element formed on the GaAs to the integrated circuit formed on the silicon wafer by a metal lead.

PRIOR ART DOCUMENT

Patent Document

Patent Document 1: JP4-233720

SUMMARY OF THE INVENTION

Problems to be Solved by the Invention

However, the above-mentioned semiconductor device is such that a silicon wafer, a germanium-silicon alloy, and GaAs are arranged in the direction vertical to the main plane of the silicon wafer in the stated order. A plurality of germanium-silicon alloys and a plurality of GaAs are formed on the silicon wafer. The width of the semiconductor band gap of the germanium-silicon alloy is typically narrow as from 0.7 to 1.1 eV, with which it is difficult to achieve a resistivity as high as no smaller than $10^5$ Ωcm. In addition, since the constituting component of GaAs and the constituting component of a germanium-silicon alloy are electrically active impurities in relation to each other, doping occurs by interdiffusion of these components, which tends to further decrease the resistivity. As a result of decrease in resistivity of the germanium-silicon alloy layer, insulation between GaAs and the silicon wafer may become insufficient, which leads to instable operation of the semiconductor device in some cases.

Means for Solving the Problems

For a solution to the above-mentioned problems, according to the first aspect related to the present invention, provided is one exemplary semiconductor wafer including: a base wafer; a seed crystal disposed on the base wafer; a compound semiconductor disposed above the seed crystal; and a high resistance layer disposed between the seed crystal and the compound semiconductor, the high resistance layer having a larger resistivity than the seed crystal, where the seed crystal lattice matches or pseudo lattice matches the compound semiconductor. For example, the lattice spacing of the compound semiconductor in the direction parallel to the main plane of the base wafer is substantially equal to the lattice spacing of the seed crystal in the direction parallel to the main plane. In addition, the high resistance layer lattice can match or pseudo lattice match the seed crystal, and the compound semiconductor lattice can match or pseudo lattice match the high resistance layer. For example, the base wafer is a Si wafer, a SOI wafer, or a GOI wafer.

The semiconductor wafer may further include: an inhibition layer that has been formed on the base wafer and inhibits a precursor of the seed crystal from growing into a crystal, where an opening penetrating the inhibition layer to the base wafer has been formed, and the seed crystal has been disposed inside the opening. For example, the seed crystal comprises $Si_xGe_{1-x}$ crystal ($0 \le x < 1$).

In the semiconductor wafer, the high resistance layer comprises an oxide dielectric, for example. The oxide dielectric may be formed by selectively oxidizing a part of the compound semiconductor. The oxide dielectric may be formed by oxidizing a group III-V compound semiconductor containing Al. The high resistance layer comprises a group III-V compound semiconductor containing B or an oxygen-doped group III-V compound semiconductor containing Al, for example.

The seed crystal may be a p-type semiconductor, the compound semiconductor may be an n-type semiconductor, and the high resistance layer may be a depletion layer of the compound semiconductor. For example, the seed crystal is high-concentration p-type Ge, and the compound semiconductor is low-concentration n-type $Al_yGa_{1-y}As$ ($0 \le y \le 1$). In addition, the seed crystal may be low-concentration p-type SiGe, and the compound semiconductor may be low-concentration n-type $In_zGa_{1-z}P$ ($0 \le z \le 1$).

The semiconductor wafer may be manufactured by: disposing the seed crystal on the base wafer; forming, by crystal growth, a precursor layer lattice matching or pseudo lattice matching the seed crystal; forming, by crystal growth, the compound semiconductor lattice matching or pseudo lattice matching the precursor layer; and forming the high resistance layer by selectively oxidizing the precursor layer. For example, the seed crystal comprises a $Si_xGe_{1-x}$ crystal ($0 \le x < 1$), and the precursor layer comprises a group III-V compound semiconductor containing Al.

In addition, the semiconductor wafer may be manufactured by: forming, on the base wafer, an inhibition layer that inhibits a precursor of the seed crystal from growing into a crystal; forming, in the inhibition layer, an opening penetrating the inhibition layer to the base wafer; providing the seed crystal inside the opening; forming, by crystal growth, a precursor layer lattice matching or pseudo lattice matching the seed crystal; forming, by crystal growth, the compound semiconductor lattice matching or pseudo lattice matching the precursor layer; and forming the high resistance layer by selectively oxidizing the precursor layer. A void may be formed between the precursor layer and an inner wall of the opening in the semiconductor wafer, and the semiconductor wafer may be manufactured by: introducing oxygen through a plane of the precursor layer in contact with the void, thereby selectively oxidizing the precursor layer. The semiconductor wafer may also be manufactured by: forming, by crystal growth, the precursor layer to protrude from a surface of the inhibition layer; forming, by crystal growth, the compound semiconductor along the inhibition layer using the precursor layer as a nucleus; and selectively oxidizing the precursor layer.

According to the second aspect related to the present invention, provided is an exemplary electronic device comprising: a base wafer; a seed crystal disposed on the base wafer; a compound semiconductor disposed above the seed crystal; a high resistance layer disposed between the seed crystal and the compound semiconductor, the high resistance layer having a larger resistivity than the seed crystal; and a first electronic element formed in the compound semiconductor, where the seed crystal lattice matches or pseudo lattice matches the compound semiconductor. For example, the electronic device further comprises: an inhibition layer that has been formed on the base wafer and inhibits a precursor of the seed crystal from growing into a crystal, where an opening penetrating the inhibition layer to the base wafer has been formed in the inhibition layer, and the seed crystal has been formed inside the opening.

The electronic device may further comprise: a second electronic element formed on the base wafer, where the inhibition layer has been formed above the second electronic element. The high resistance layer has been formed by selectively oxidizing a part of the compound semiconductor, for example.

According to the third aspect related to the present invention, provided is an exemplary method of manufacturing a semiconductor wafer, comprising: a step of preparing a base wafer; a step of disposing a seed crystal on the base wafer; a step of forming, by crystal growth, a precursor layer lattice matching or pseudo lattice matching the seed crystal; a step of forming, by crystal growth, a compound semiconductor lattice matching or pseudo lattice matching the precursor layer; and a step of selectively oxidizing the precursor layer. The precursor layer comprises a group III-V compound semiconductor containing Al, for example. The manufacturing method may further comprise: a step of forming, on the base wafer, an inhibition layer that inhibits a precursor of the seed crystal from growing into a crystal; a step of forming, in the inhibition layer, an opening penetrating the inhibition layer to the base wafer; and a step of providing the seed crystal inside the opening.

In the manufacturing method, the seed crystal may comprise $Si_xGe_{1-x}$ crystal ($0 \leq x < 1$), and the step of disposing the seed crystal on the base wafer may comprise: a step of growing a precursor of the $Si_xGe_{1-x}$ crystal into a crystal by an epitaxial growth method; and a step of annealing the $Si_xGe_{1-x}$ crystal. In addition, the manufacturing method may comprise: a step of preparing a base wafer; a step of disposing a seed crystal on the base wafer; a step of disposing a high resistance layer having a higher resistivity than the seed crystal, the high resistance layer lattice matching or pseudo lattice matching the seed crystal; and a step of forming, by crystal growth, a compound semiconductor lattice matching or pseudo lattice matching the high resistance layer.

MODE FOR CARRYING OUT THE INVENTION

Figure 1:
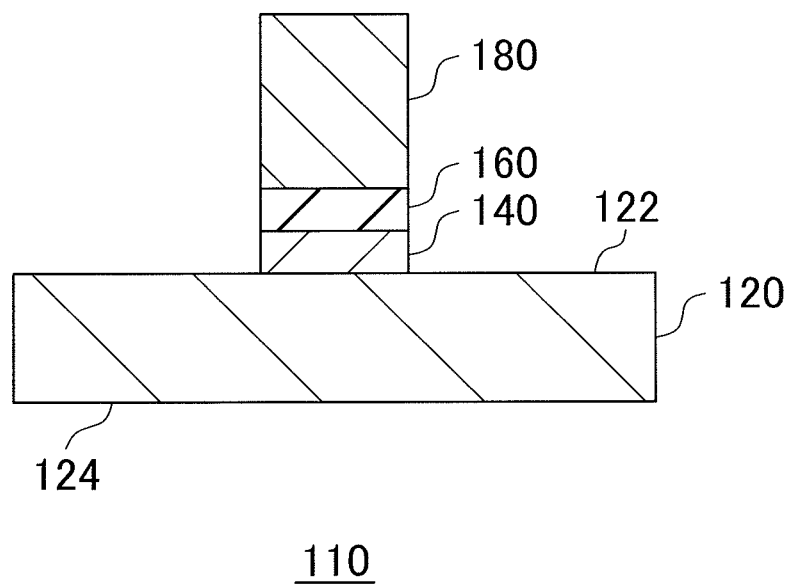
FIG. 1 schematically shows an example of a cross section of a semiconductor wafer 110.

Some aspects of the invention will now be described based on the embodiments, which do not intend to limit the scope of the present invention, but exemplify the invention. All of the features and the combinations thereof described in the embodiment are not necessarily essential to the invention. Hereinafter, (some) embodiment(s) of the present invention will be described with reference to the drawings. In the drawings, the same or similar features are occasionally assigned the same reference numeral, and the overlapping explanation is omitted. Also note that the drawings are schematic representation, where the relation, the ratio or the like of the thickness and the planar size may be different from the actual ones. The relation or the ratio between the sizes may be different among the drawings, too, for facilitating explanation.

FIG. 1 schematically shows an example of a cross section of a semiconductor wafer 110. The semiconductor wafer 110 includes a base wafer 120, a seed crystal 140, a high resistance layer 160, and a compound semiconductor 180. The base wafer 120 has a first main plane 122 and a second main plane 124. The seed crystal 140 is disposed on the base wafer 120. The high resistance layer 160 is disposed in contact with the seed crystal 140.

The compound semiconductor 180 is disposed above the seed crystal 140 and in contact with the high resistance layer 160. In this example, the compound semiconductor 180 and the seed crystal 140 are disposed to sandwich the high resistance layer 160 therebetween. The seed crystal 140 and the compound semiconductor 180 lattice match or pseudo lattice match each other. In this specification, the concept "above A" means any position in a direction farther from "A," including a position on the plane of "A," the direction being to be away from the base wafer 120.

For example, "A" is a seed crystal 140 or a second electronic element 580. Therefore, "above the seed crystal 140" means any position in a direction farther from the surface of the seed crystal 140, the direction being to be away from the base wafer 120. The concept "below A" means any position in a direction closer to the base wafer 120 from "A."

Moreover, in the present specification, "pseudo lattice match" is used to describe a phenomenon where the difference in lattice constant between the two semiconductors is small although not a complete lattice match, and so the occurrence of defects due to lattice mismatch is not noticeable and two semiconductors can still be stacked. When the semiconductors "pseudo lattice match," the crystal lattices of the semiconductors deform within the elastically deformable range, thereby absorbing the difference in lattice constant. For example, when Ge and GaAs are stacked, they "pseudo lattice match." Even when two semiconductors are not in contact with each other, the two semiconductors are defined to "lattice match" or "pseudo lattice match" if the lattice constant is the same for the two semiconductors, or the difference in lattice constant is sufficiently small as mentioned above, in the present specification.

For example, when the seed crystal 140 and the compound semiconductor 180 lattice match or pseudo lattice match, the lattice spacing of the compound semiconductor 180 in a plane parallel to the first main plane 122 of the base wafer 120 is substantially the same as the lattice spacing of the seed crystal 140 in a plane parallel to the first main plane 122. Preferably, the difference between the lattice spacing of the compound semiconductor 180 in a plane parallel to the first main plane 122 of the base wafer 120 and the lattice spacing of the seed crystal 140 in a plane parallel to the first main plane 122 is within the range of 3% of each unit distance. The high resistance layer 160 may lattice match or pseudo lattice match the seed crystal 140. The compound semiconductor 180 may lattice match or pseudo lattice match the high resistance layer 160.

The base wafer 120 may be one of a Si wafer, a SOI (silicon-on-insulator) wafer, a Ge wafer, a GOI (germanium-on-insulator) wafer, and a GaAs wafer, for example. The Si wafer may be a single-crystal Si wafer. The base wafer 120 may be a sapphire wafer, a glass wafer, and a wafer made of resin (e.g., PET film).

The seed crystal 140 is in contact with the first main plane 122 of the base wafer 120. The seed crystal 140 provides a seed plane suited for crystal growth of the compound semiconductor 180. The seed crystal 140 restricts the impurities in the base wafer 120 or the first main plane 122 from adversely affecting the crystallinity of the high resistance layer 160 or the compound semiconductor 180. The seed crystal 140 includes a semiconductor crystal, for example. To be specific, the seed crystal 140 may include a $Si_xGe_{1-x}$ crystal layer. Here, "x" is a real number satisfying (0≤x<1). The seed crystal 140 may include a plurality of layers.

The seed crystal 140 may be formed by an epitaxial growth method, for example. Chemical Vapor Deposition (occasionally referred to as "CVD"), Metal Organic Chemical Vapor Deposition (occasionally referred to as "MOCVD"), Molecular Beam Epitaxy (occasionally referred to as "MBE"), or Atomic Layer Deposition (occasionally referred to as "ALD") may be used to form the seed crystal 140. After a semiconductor crystal layer is formed in these methods, the crystal layer may be patterned by the photography (e.g., etching), thereby forming seed crystal 140 on a part of the base wafer 120.

Preferably, the seed crystal 140 is annealed. Occasionally, defects such as lattice defect may occur inside the seed crystal 140, due to the difference in lattice constant between the base wafer 120 and the seed crystal 140. By heating and annealing of the seed crystal 140, the defects move inside the seed crystal 140, to be eventually caught by the interface or the surface of the seed crystal 140, or by the gettering sink inside the seed crystal 140. Therefore, by annealing the seed crystal 140, the crystallinity of the seed crystal 140 can be improved. The seed crystal 140 may be formed by annealing polycrystal or amorphous $Si_xGe_{1-x}$ crystal.

The annealing may be conducted in several steps. For example, high-temperature annealing may be conducted at a temperature not reaching the melting point of the seed crystal 140, followed by low-temperature annealing at a temperature lower than the temperature adopted by the high-temperature annealing. This two-step annealing may be repeated a plurality of times. The temperature and duration of the high-temperature annealing may for example be from 850 to 900 degrees centigrade for 2 to 10 minutes, when the seed crystal 140 includes $Si_xGe_{1-x}$ crystal layer (0≤x<1). The temperature and duration of the low-temperature annealing may be from 650 to 780 degrees centigrade for 2 to 10 minutes. Such a two-step annealing is repeated for 10 times, for example.

In FIG. 1, the high resistance layer 160 is in contact with the seed crystal 140. There may be another layer interposed between the high resistance layer 160 and the seed crystal 140. For example, the high resistance layer 160 lattice matches or pseudo lattice matches a buffer layer lattice matching or pseudo lattice matching the seed crystal 140.

The resistivity of the high resistance layer 160 is larger than the resistivity of the seed crystal 140. The resistance value of the high resistance layer 160 in the direction vertical to the first main plane 122 of the base wafer 120 may be larger than the resistance value of the seed crystal 140. In this configuration, the high resistance layer 160 electrically separates the base wafer 120 from the compound semiconductor 180. As a result, electronic elements, after respectively formed on a plurality of compound semiconductors 180 on the base wafer 120, are insulated and separated from each other.

The high resistance layer 160 includes an oxide dielectric, for example. The high resistance layer 160 may include an oxide dielectric obtained by oxidizing a group III-V compound semiconductor containing Al. A group III-V compound semiconductor containing Al may be AlGaAs or AlInGaP. A group III-V compound semiconductor containing Al may be formed by an epitaxial growth method such as MOCVD. A group III-V compound semiconductor containing Al may be oxidized after forming the compound semiconductor 180. The high resistance layer 160 includes a group III-V compound semiconductor containing Al and doped with oxygen. The high resistance layer 160 may include a group III-V compound semiconductor containing B.

In the present specification, the resistivity is defined as specific resistance. The resistivity of a semiconductor is measured by a four-terminal method by attaching an ohmic electrode to the semiconductor. For electrically separating the base wafer 120 from the compound semiconductor 180, it is preferable that the width of the band gap of the high resistance layer 160 is equal to or greater than 1.4 eV, and the resistivity of the high resistance layer 160 is at least $10^5$ Ωcm or a greater value. It is more preferable if the width of the band gap of the high resistance layer 160 is equal to or greater than 1.6 eV, and the resistivity of the high resistance layer 160 is $10^7$ Ωcm or a greater value. It is even more preferable if the width of the band gap of the high resistance layer 160 is equal to or greater than 1.8 eV, and the resistivity of the high resistance layer 160 is $10^9$ Ωcm or a greater value so as to realize various applications such as a semiconductor device to which high voltages are applicable. By using the high resistance layer 160 as explained above, the leak current density between the base wafer 120 and the compound semiconductor 180 can be restrained to 1 A/cm$^2$ or below.

The compound semiconductor 180 is in contact with the high resistance layer 160. The compound semiconductor 180 lattice matches or pseudo lattice matches the seed crystal 140. The compound semiconductor 180 is electrically separated from the base wafer 120 by the high resistance layer 160.

Here, the concept "electrically separated" used in the present specification does not require complete insulation between the base wafer 120 and the compound semiconductor 180. For example, the compound semiconductor 180 should be electrically separated from the base wafer 120 so as to realize stable operation of the electronic element formed using the compound semiconductor 180.

As explained above, by forming, at both sides of the high resistance layer 160, the seed crystal 140 and the compound semiconductor 180 lattice matching or pseudo lattice matching each other, the base wafer 120 can be electrically separated from the compound semiconductor 180, as well as achieving excellent crystallinity for the compound semiconductor 180.

As a high resistance layer 160, a compound semiconductor whose resistivity increases by being oxidized may be used. By forming a compound semiconductor 180 lattice matching or pseudo lattice matching this compound semiconductor and thereafter oxidizing this compound semiconductor, the base wafer 120 can be electrically separated from the compound semiconductor 180. That is, the high resistance layer 160 does not prevent lattice matching or pseudo lattice matching of the seed crystal 140 and the compound semiconductor 180, at the time of forming the compound semiconductor 180. Accordingly, the compound semiconductor 180 can achieve excellent crystallinity, while electrically insulating the base wafer 120 from the compound semiconductor 180.

Figure 2A:
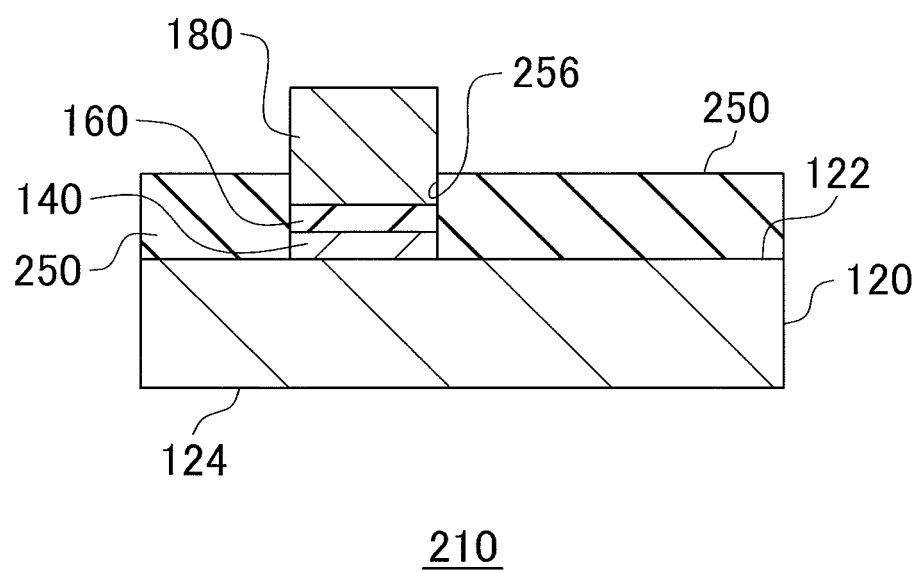
FIG. 2A schematically shows an example of a cross section of a semiconductor wafer 210.

FIG. 2A schematically shows an example of a cross section of a semiconductor wafer 210. The semiconductor wafer 210 includes a base wafer 120, a seed crystal 140, a high resistance layer 160, a compound semiconductor 180, and an inhibition layer 250. The base wafer 120 has a first main plane 122 and a second main plane 124. An opening 256 is formed through the inhibition layer 250. The semiconductor wafer 210 is different from the semiconductor wafer 110 in that seed crystal 140 is disposed in the opening 256.

The inhibition layer 250 inhibits the precursor of the seed crystal 140 and the compound semiconductor 180 from growing into a crystal. For example, when an epitaxial growth method is adopted to grow the crystal of the compound semiconductor 180, the compound semiconductor 180 is inhibited from epitaxially growing on the surface of the inhibition layer 250. The inhibition layer 250 is formed in contact with the first main plane 122 of the base wafer 120, for example.

The inhibition layer 250 may be a silicon oxide layer, an aluminum oxide layer, a silicon nitride layer, a silicon oxinitride layer, a tantalum nitride layer, a titanium nitride layer, or a layer obtained by stacking them. The thickness of the inhibition layer 250 is from 0.05 to 5 μm, for example. The inhibition layer 250 is formed by CVD, for example.

The opening 256 penetrates the inhibition layer 250 in a direction substantially vertical to the first main plane 122 of the base wafer 120. Accordingly, the opening 256 exposes the first main plane 122. The seed crystal 140 is disposed inside the opening 256, to be in contact with the base wafer 120. When the seed crystal 140 is epitaxially grown, the precursor of the seed crystal 140 is inhibited from growing into a crystal on the surface of the inhibition layer 250. As a result, the precursor of the seed crystal 140 is selectively grown into a crystal inside the opening 256. The opening 256 is formed by photolithography such as etching, for example. The concept "a direction substantially vertical" in the present specification is not limited to the strictly vertical direction, and also includes directions slightly tilted from the vertical direction, taking into consideration the manufacturing errors of a wafer and each component.

The opening 256 has an aspect ratio equal to or greater than $(\sqrt{3})/3$. When a crystal having a predetermined thickness is formed inside the opening 256 having an aspect ratio equal to or greater than $(\sqrt{3})/3$, the defects such as lattice defect included in the crystal is terminated by the wall surface of the opening 256. As a result, the surface of the crystal exposed in the opening 256 has excellent crystallinity when the crystal is formed.

The concept "aspect ratio of the opening" in the present specification is obtained by dividing the depth of the opening by the width of the opening. For example, the "Electronic Information Communication Handbook, Separate Volume 1," Page 751, 1988, edited by The Institute of Electronics, Information and Communication Engineers, published by Ohmsha defines an aspect ratio as an etching depth divided by a pattern width. The term "aspect ratio" is used in the present specification in the same meaning.

The concept "depth of the opening" is the depth in the stacking direction in which thin films are stacked on a wafer, and "width of the opening" is the width in the direction vertical to the stacking direction. When the opening has a plurality of widths, the minimum width is used in calculating the aspect ratio of the opening. For example, when the shape of the opening observed in the stacking direction is rectangular, the length of the short side of the rectangle is used in calculating the aspect ratio.

The high resistance layer 160 is disposed inside the opening 256, for example. The compound semiconductor 180 is grown in contact with the high resistance layer 160 inside the opening 256. The high resistance layer 160 and the compound semiconductor 180 have excellent crystallinity. The compound semiconductor 180 is formed to protrude from the surface of the inhibition layer 250.

Figure 2B:
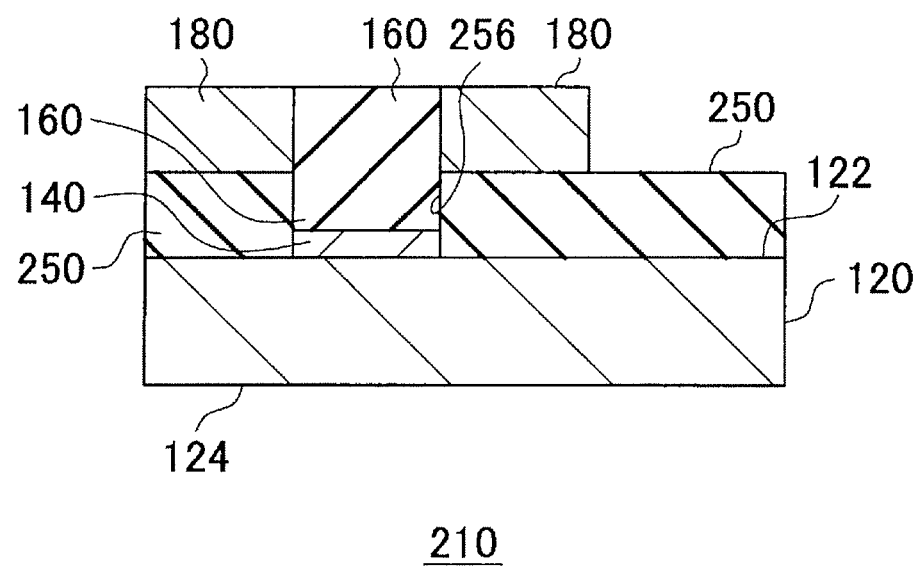
FIG. 2B schematically shows an example of a cross section of a semiconductor wafer 210.

FIG. 2B schematically shows another example of a cross section of a semiconductor wafer 210. In this drawing, the high resistance layer 160 is grown in contact with the seed crystal 140 inside the opening 256, to protrude from the surface of the inhibition layer 250. The compound semiconductor 180 may be formed along the surface of the inhibition layer 250, using as a nucleus of the crystal growth, the high resistance layer 160 formed to protrude from the surface of the inhibition layer 250.

In FIG. 2B, the compound semiconductor 180 is laterally grown along the surface of the inhibition layer 250. As shown in FIG. 2B, when the compound semiconductor 180 is grown along the surface of the inhibition layer 250 as the upper plane of the high resistance layer 160 is exposed, the high resistance layer 160 can be easily oxidized after formation of the compound semiconductor 180. The compound semiconductor 180 may be formed above the high resistance layer 160 by crystal growth, to cover the high resistance layer 160.

Figure 2C:
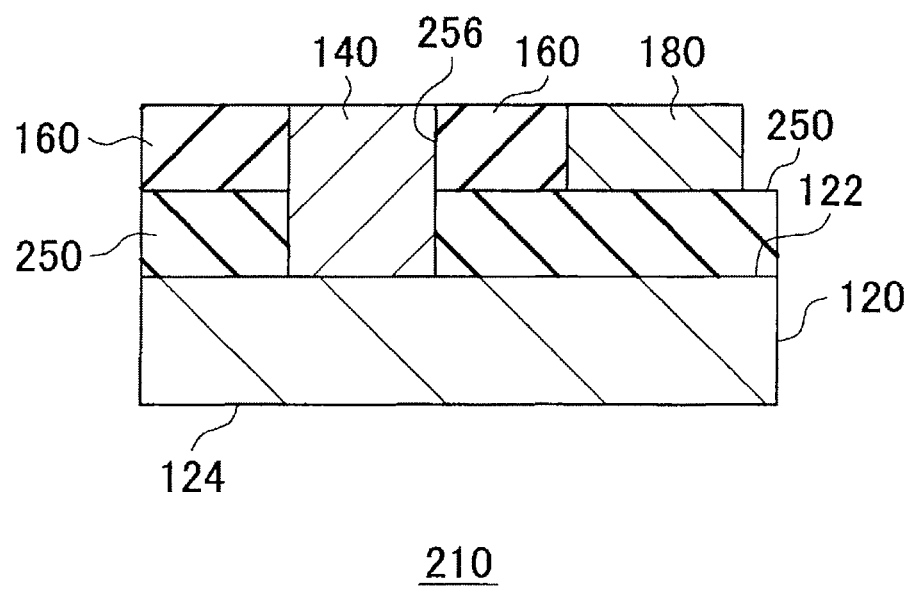
FIG. 2C schematically shows an example of a cross section of a semiconductor wafer 210.

FIG. 2C schematically shows another example of a cross section of a semiconductor wafer 210. In this drawing, the seed crystal 140 may be formed by crystal growth in contact with the base wafer 120 inside the opening 256 so as to protrude from the surface of the inhibition layer 250. The high resistance layer 160 may be laterally grown along the surface of the inhibition layer 250, using as a nucleus of the lateral growth, the seed crystal 140 formed to protrude from the surface of the inhibition layer 250 by crystal growth.

In this case, the compound semiconductor 180 is laterally grown along the inhibition layer 250, using the high resistance layer 160 as a nucleus of the lateral growth. Because the compound semiconductor 180 does not cover the high resistance layer 160, the high resistance layer 160 can be easily oxidized after formation of the compound semiconductor 180. That is, it is possible to easily oxidize the high resistance layer 160 to raise the resistivity of the high resistance layer 160.

Figure 3:
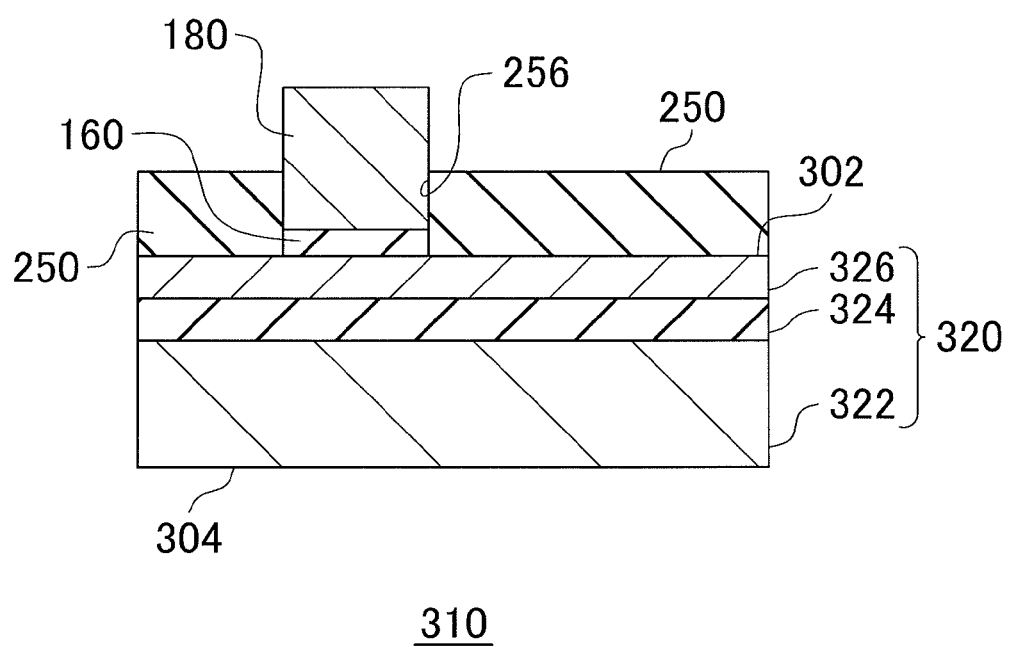
FIG. 3 schematically shows an example of a cross section of a semiconductor wafer 310.

FIG. 3 schematically shows an example of a cross section of a semiconductor wafer 310. The semiconductor wafer 310 includes a GOI wafer 320, a high resistance layer 160, a compound semiconductor 180, and an inhibition layer 250. The GOI wafer 320 includes a wafer 322, a dielectric 324, and a $Si_xGe_{1-x}$ crystal layer 326. The GOI wafer 320 has a front plane 302 on which the $Si_xGe_{1-x}$ crystal layer 326 is disposed and a rear plane 304. The semiconductor wafer 310 is different from the semiconductor wafer 210, in that the $Si_xGe_{1-x}$ crystal layer 326 of the GOI wafer 320 is used instead of the seed crystal 140.

The wafer 322, the dielectric 324, the $Si_xGe_{1-x}$ crystal layer 326, and the inhibition layer 250 are disposed in the stated order in the direction vertical to the surface 302 of the GOI wafer 320. The inhibition layer 250 inhibits the precursor of the $Si_xGe_{1-x}$ crystal layer 326 from growing into a crystal. An opening 256 is provided through the inhibition layer 250 to reach the $Si_xGe_{1-x}$ crystal layer 326. A high resistance layer 160 is disposed inside the opening 256. The wafer 322, the dielectric 324, the $Si_xGe_{1-x}$ crystal layer 326, the high resistance layer 160, and the compound semiconductor 180 are disposed in the stated order in the direction vertical to the surface 302 of the GOI wafer 320.

The wafer 322 is a single crystal Si wafer, for example. The dielectric 324 electrically separates the wafer 322 from the $Si_xGe_{1-x}$ crystal layer 326. The $Si_xGe_{1-x}$ crystal layer 326, corresponding to the seed crystal 140, provides a seed plane suited for crystal growth of the compound semiconductor 180. It is preferable that the $Si_xGe_{1-x}$ crystal layer 326 is annealed in the same manner as in the seed crystal 140. By doing so, the crystallinity of the $Si_xGe_{1-x}$ crystal layer 326 improves. The annealing is selectively conducted on the portion exposed from the opening 256, for example.

The high resistance layer 160 is disposed inside the opening 256 to be in contact with the $Si_xGe_{1-x}$ crystal layer 326. The resistivity of the high resistance layer 160 is larger than the resistivity of the $Si_xGe_{1-x}$ crystal layer 326. The compound semiconductor 180 is in contact with the high resistance layer 160. The compound semiconductor 180 lattice matches or pseudo lattice matches the $Si_xGe_{1-x}$ crystal layer 326, in the state in which the high resistance layer 160 is disposed between the compound semiconductor 180 and the $Si_xGe_{1-x}$ crystal layer 326. Accordingly, the compound semiconductor 180 is electrically separated from the $Si_xGe_{1-x}$ crystal layer 326. As a result, the compound semiconductor 180 is electrically separated from the GOI wafer 320. In addition, the compound semiconductor 180 is electrically separated from the wafer 322. Except for the stated features, the high resistance layer 160 and the compound semiconductor 180 have a configuration corresponding to the configuration of the semiconductor wafer 210.

Figure 4:
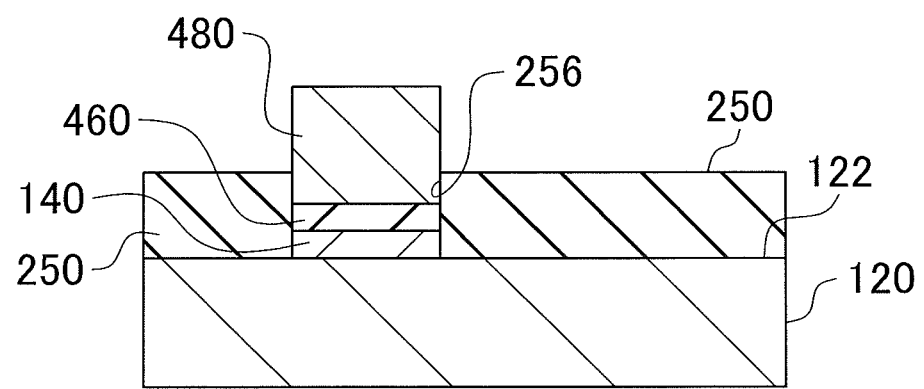
FIG. 4 schematically shows an example of a cross section of a semiconductor wafer 410.

FIG. 4 schematically shows an example of a cross section of a semiconductor wafer 410. The semiconductor wafer 410 includes a base wafer 120, seed crystal 140, an inhibition layer 250, and a compound semiconductor 480. The base wafer 120 has a first main plane 122 and a second main plane 124. An opening 256 is provided through the inhibition layer 250. A separation section 460 is formed in the compound semiconductor 480. The semiconductor wafer 410 is different from the semiconductor wafer 210 in that the semiconductor wafer 410 does not include a high resistance layer 160 and that a separation section 460 is formed in the compound semiconductor 480.

The compound semiconductor 480 is equivalent to the compound semiconductor 180. The compound semiconductor 480 is in contact with the seed crystal 140 inside the opening 256. By selecting the materials of the seed crystal 140 and the compound semiconductor 480, a depletion layer is formed in the vicinity of the interface with the seed crystal 140 inside the compound semiconductor 480. The depletion layer is an example of the separation section 460 electrically separating the compound semiconductor 480 from the base wafer 120. Accordingly, the compound semiconductor 480 is electrically separated from the base wafer 120. Note that the depletion layer may be formed inside the seed crystal 140.

For example, when the seed crystal 140 are high-concentration p-type germanium, and the compound semiconductor 480 is low-concentration n-type $Al_yGa_{1-y}As$ (0≤y≤1), a depletion layer is formed inside the compound semiconductor 480 as the separation layer 460. When the seed crystal 140 is low-concentration p-type silicon germanium, and the compound semiconductor 480 is high-concentration n-type $In_zGa_{1-z}P$ (0≤z≤1), a depletion layer is formed inside the seed crystal 140 as the separation layer 460. It is preferable that the "z" is a value within a 10% deviation from 0.48.

Figure 5:
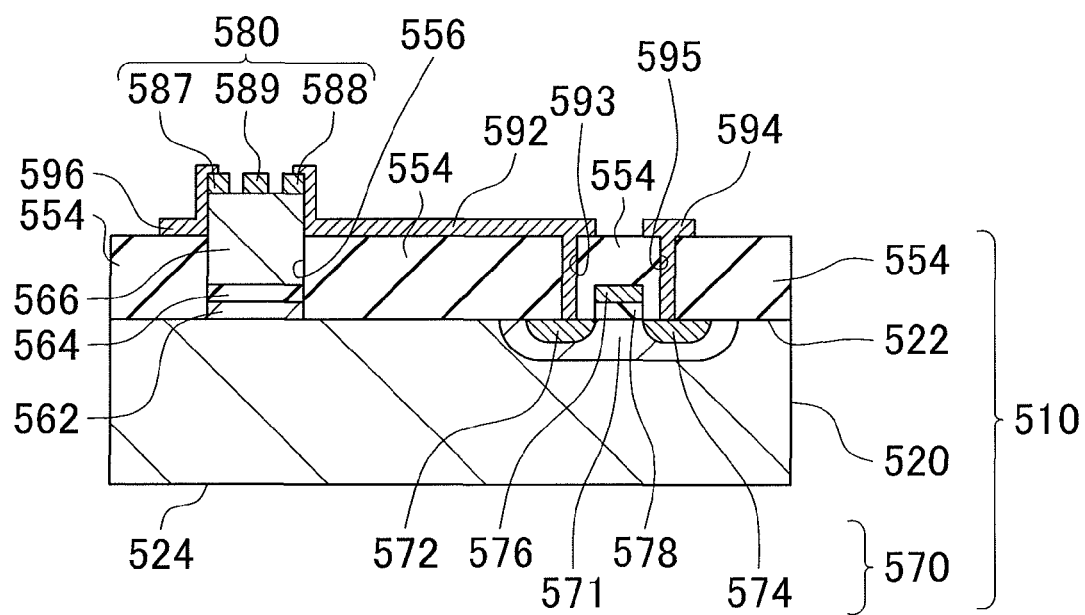
FIG. 5 schematically shows an example of a cross section of an electronic device 500.

FIG. 5 schematically shows an example of a cross section of an electronic device 500. The electronic device 500 includes a semiconductor wafer 510, a second electronic element 580, an interconnection 592, an interconnection 594, and an interconnection 596. The semiconductor wafer 510 includes a base wafer 520, an inhibition layer 554, a seed crystal 562, and a compound semiconductor 566. An opening 556, an opening 593, and an opening 595 are formed through the inhibition layer 554.

The base wafer 520 has a first main plane 522 and a second main plane 524. A first electronic element 570 is formed on the base wafer 520. The first electronic element 570 includes a well 571, a source region 572, a drain region 574, a gate electrode 576, and a gate insulating film 578.

The second electronic element 580 is formed on the compound semiconductor 566. The second electronic element 580 includes an input/output electrode 587, an input/output electrode 588, and a gate electrode 589.

The base wafer 520, the first main plane 522, and the second main plane 524 are equivalent to the base wafer 120, the first main plane 122, and the second main plane 124. Therefore, the base wafer 520, the first main plane 522, and the second main plane 524 are not explained below. The inhibition layer 554 and the opening 556 are equivalent to the inhibition layer 250 and the opening 256. Therefore, only the differences from the inhibition layer 250 and the opening 256 are explained below. The inhibition layer 554 is different from the inhibition layer 250 in that the inhibition layer 554 includes an opening 593 and an opening 595.

The opening 593 and the opening 595 penetrate the inhibition layer 554 in a direction substantially vertical to the first main plane 522. The opening 593 and the opening 595 respectively expose the source region 572 and the drain region 574. Respectively inside the opening 593 and the opening 595, part of the interconnection 592 and part of the interconnection 594 are formed. Accordingly, the first electronic element 570 is electrically coupled to different electronic element(s) such as the second electronic element 580. The opening 593 and the opening 595 may be formed by reactive ion etching, for example.

The seed crystal 562 have a configuration corresponding to the configuration of the seed crystal 140. Therefore, not all the configuration of the seed crystal 562 corresponding to the configuration of the seed crystal 140 is explained in the description below. The seed crystal 562, in the state of being provided with the high resistance layer 564 above, provides a seed plane desirable for the compound semiconductor 566. The seed crystal 562 restrains the impurities in the base wafer 520 or on the first main plane 522 from adversely affecting the crystallinity of the high resistance layer 564 or the compound semiconductor 566. the seed crystal 562 is disposed inside the opening 556. The seed crystal 562 is in contact with the first main plane 522. The seed crystal 562 may be $Si_xGe_{1-x}$ crystal, for example. Here, "x" is a real number satisfying $0 \leq x < 1$.

The seed crystal 562 may be formed by an epitaxial growth method such as CVD. Because the precursor of the seed crystal 562 is inhibited from growing into a crystal on the surface of the inhibition layer 554, the seed crystal 562 is selectively grown inside the opening 556. Preferably, the seed crystal 562 is annealed. The annealing for the seed crystal 562 may be the same as the annealing for the seed crystal 140. Accordingly, the defect density inside the seed crystal 562 can be decreased, and a seed plane desirable for the compound semiconductor 566 can be provided.

For example, the annealing may be flash annealing conducted by means of pulses of electromagnetic waves irradiated from a lamp a plurality of times. The annealing may be performed by selectively heating the seed crystal 562 by irradiating electromagnetic waves onto the semiconductor wafer 510 provided with a protection layer for protecting the first electronic element 570 from the electromagnetic waves. The protection layer is formed on a portion of the semiconductor wafer 510 excluding the opening 556, for example. The protection layer may include a reflection layer reflecting at least a part of the electromagnetic waves. The reflection layer may be a metal thin film, for example. The protection layer may include a scattering layer for scattering at least a part of the electromagnetic waves. The scattering layer is a layer that includes particulates such as colloidal silica, for example.

The annealing may be performed by selectively heating the seed crystal 562 by irradiating electromagnetic waves onto the semiconductor wafer 510 provided with an absorption layer that heats the seed crystal 562 by absorbing electromagnetic waves and generating heat. The absorption layer may be amorphous silicon, for example. The annealing may be performed by selectively heating the seed crystal 562 by irradiating the semiconductor wafer 510 with electromagnetic waves having a wavelength selectively absorbed by the seed crystal 562.

The high resistance layer 564 has a configuration corresponding to the configuration of the high resistance layer 160. Therefore, the configuration of the high resistance layer 564 corresponding to the configuration of the high resistance layer 160 is occasionally omitted from the description below. The high resistance layer 564 is in contact with the seed crystal 562, for example. The resistivity of the high resistance layer 564 is larger than the resistivity of the seed crystal 562. The high resistance layer 564 may be an oxide dielectric formed by selectively oxidizing a part of the compound semiconductor 566. The high resistance layer 564 may include an oxide dielectric obtained by oxidizing a group III-V compound semiconductor containing Al.

A group III-V compound semiconductor containing Al may be AlGaAs or AlInGaP. AlGaAs or AlInGaP may be formed by an epitaxial growth method such as MOCVD. When the base wafer 520 includes $Si_xGe_{1-x}$ crystal ($0 \leq x < 1$) on the first main plane 522, such as a Ge wafer and a GOI wafer, the high resistance layer 564 may be formed in contact with the first main plane 522. In this case, the seed crystal 562 may not be formed on the base wafer 520.

The compound semiconductor 566 has a configuration corresponding to the configuration of the compound semiconductor 180. Therefore, not all the configuration of the compound semiconductor 566 corresponding to the configuration of the compound semiconductor 180 is explained in the description below. The compound semiconductor 566 lattice matches or pseudo lattice matches the seed crystal 562, for example. The compound semiconductor 566 may lattice match or pseudo lattice match the seed crystal 562, while in contact with the high resistance layer 564. The compound semiconductor 566 is electrically separated from the seed crystal 562 by the high resistance layer 564. Accordingly, the compound semiconductor 566 is electrically separated from the base wafer 520.

For example, the compound semiconductor 566 is a crystal of a group III-V compound semiconductor such as GaAs. The compound semiconductor 566 may include a plurality of layers. The interface between the compound semiconductor 566 and the high resistance layer 564 may be inside the opening 556. The compound semiconductor 566 may be formed by an epitaxial growth method such as MOCVD.

The first electronic element 570 is formed on at least a part of the region of the base wafer 520 not exposed by the opening 556. The first electronic element 570 is a MOSFET, for example. The first electronic element 570 is included in at least one of the driving circuit of the second electronic element 580, the correction circuit for enhancing the linearity of the input/output characteristics of the second electronic element 580, and the protection circuit at the input stage of the second electronic element 580.

The first electronic element 570 may be an active element included in a semiconductor device such as MISFET, HBT, and HEMT, a light emitting device such as a semiconductor laser, a light emitting diode, and a light emitting thyristor, a light receiving device such as an optical sensor and a photodiode, or a solar cell. The first electronic element 570 may be a passive element such as a resistor, a capacitor, and an inductor.

The second electronic element 580 is formed on the compound semiconductor 566. The second electronic element 580 is HBT, for example. The second electronic element 580 may be an electronic element included in at least one of an analog electronic device, a light emitting device such as LED, and a light receiving device such as an optical sensor.

The second electronic element 580 may be an active element included in a semiconductor device such as MISFET, HBT, and HEMT, a light emitting device such as a semiconductor laser, a light emitting diode, and a light emitting thyristor, a light receiving device such as an optical sensor and a photodiode, or a solar cell. The second electronic element 580 may be a passive element such as a resistance, a capacitor, and an inductor.

The input/output electrode 587, the input/output electrode 588, and the gate electrode 589 may be made of a conductive material. For example, the material may be a semiconductor in which metal such as Al, W, and Ti or an impurity is doped. The input/output electrode 587, the input/output electrode 588, and the gate electrode 589 may be formed by vacuum evaporation or plating.

The interconnection 592, the interconnection 594, and the interconnection 596 electrically couple the first electronic element 570 or the second electronic element 580 with the other electronic element or the like. The interconnection 592, the interconnection 594, and the interconnection 596 may be made of a conductive material, such as a semiconductor in which metal such as Al, W, and Ti or an impurity is doped. The interconnection 592, the interconnection 594, and the interconnection 596 may be formed by vacuum evaporation or plating.

The semiconductor wafer 510 may include a plurality of first electronic elements 570. The semiconductor wafer 510 may include a plurality of second electronic elements 580. Each of the first electronic elements 570 and the second electronic elements 580 is electrically coupled to a different one of the first electronic elements 570 and the second electronic elements 580.

Figure 6:
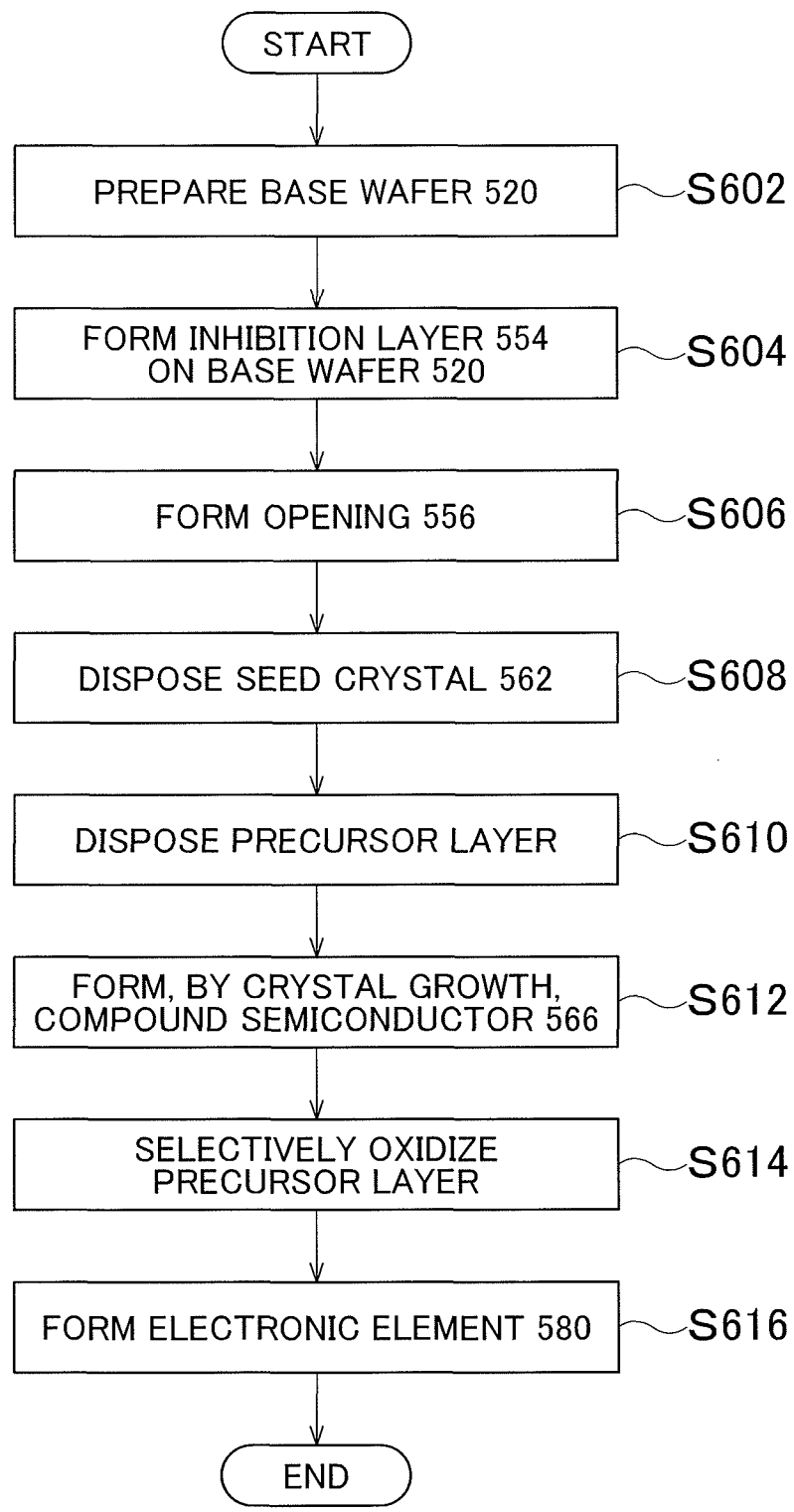
FIG. 6 is a flow chart showing an example of a manufacturing method of an electronic device 500.

FIG. 6 is a flow chart showing an example of a method of manufacturing an electronic device 500. The semiconductor wafer 510 is formed in the processes from S602 to S614. Next in S616, the second electronic element 580 is formed on the compound semiconductor 566 of the semiconductor wafer 510, and the opening 593 and the opening 595 are formed through the inhibition layer 554. Then, the interconnection 592, the interconnection 594, and the interconnection 596 are formed, thereby completing the electronic device 500.

Specifically, the base wafer 520 is prepared in S602. The first electronic element 570 may be formed on the base wafer 520. In S604, the inhibition layer 554 is formed on the base wafer 520. In S606, the opening 595 penetrating the inhibition layer 554 to reach the base wafer 520 is formed. In S608, the seed crystal 562 is formed inside the opening 595.

Next, in S610, a precursor layer including the precursor of the high resistance layer 564 is disposed on the seed crystal 562. In S612, the compound semiconductor 566 is formed on the precursor layer by crystal growth. In S614, the high resistance layer 564 can be obtained by selectively oxidizing the precursor layer. Lastly, in S616, the second electronic element 580 is formed on the compound semiconductor 566.

The high resistance layer 564 in this example is obtained by oxidizing the precursor layer lattice matching or pseudo lattice matching both of the seed crystal 562 and the compound semiconductor 566. The high resistance layer 564 may not lattice match or pseudo lattice match any of the seed crystal 562 and the compound semiconductor 566.

Figure 7:
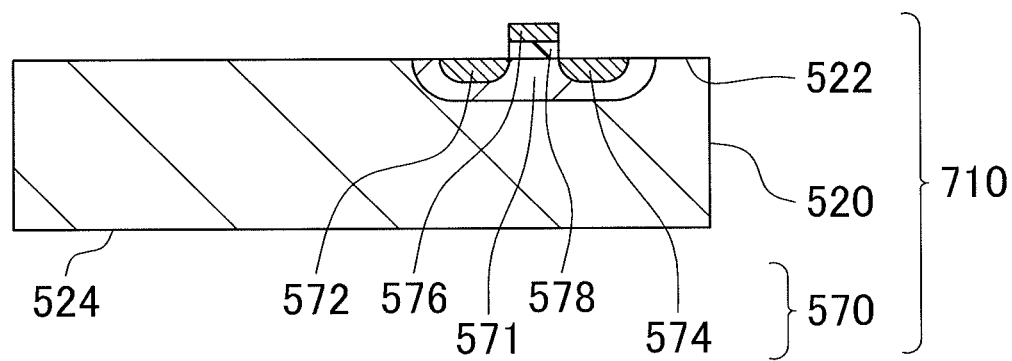
FIG. 7 schematically shows an example of a manufacturing process of a semiconductor wafer 510.

As follows, an example of the method of manufacturing the semiconductor wafer 510 is explained, with reference to FIG. 7 through FIG. 11. FIG. 7 schematically shows an example of a wafer 710 during a manufacturing process of a semiconductor wafer 510. S602 of FIG. 6 is explained as follows, with reference to FIG. 7. First, the base wafer 520 is prepared. Next, at least a part of the first electronic element 570 is formed on the base wafer 520. The base wafer 520 may be a Si wafer or a SOI wafer available in the market.

Figure 8:
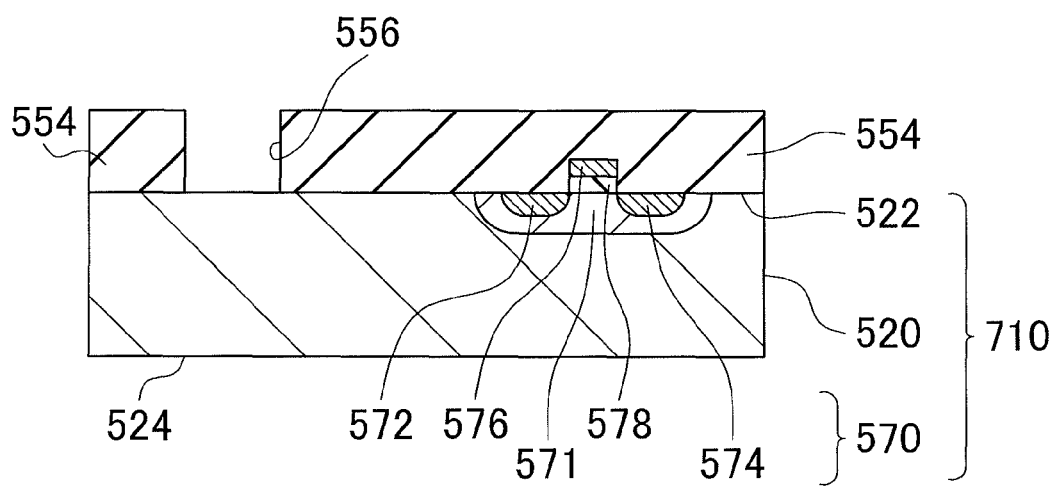
FIG. 8 schematically shows an example of a manufacturing process of a semiconductor wafer 510.

FIG. 8 schematically shows an example of the wafer 710 during a manufacturing process of a semiconductor wafer 510. S604 and S606 of FIG. 6 are explained as follows, with reference to FIG. 8. As shown in FIG. 8, the inhibition layer 554 is formed in contact with the first main plane 522 of the base wafer 520. The inhibition layer 554 is $SiO_2$, for example. The thickness of the inhibition layer 554 is from 0.05 to 5 µm, for example. The inhibition layer 554 is formed by CVD, for example. The opening 556 is formed through the inhibition layer 554 by photolithography such as etching, for example. The opening 556 may have an aspect ratio equal to or greater than $(\sqrt{3})/3$.

Figure 9:
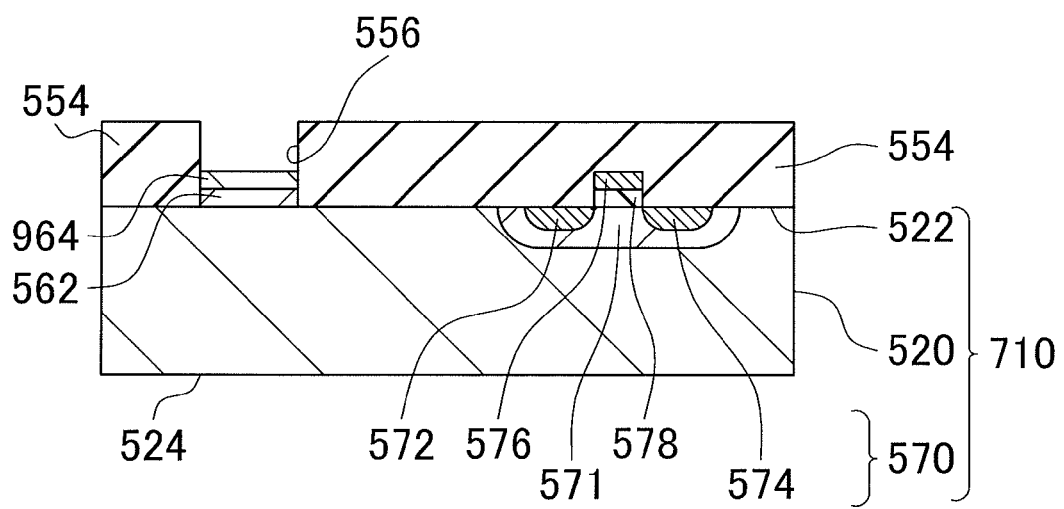
FIG. 9 schematically shows an example of a manufacturing process of a semiconductor wafer 510.

FIG. 9 schematically shows an example of the wafer 710 during a manufacturing process of a semiconductor wafer 510. S608 and S610 of FIG. 6 are explained as follows, with reference to FIG. 9. As shown in FIG. 9, the seed crystal 562 is formed inside the opening 556 to be in contact with the base wafer 520, by an epitaxial growth method. The seed crystal 562 may be $Si_xGe_{1-x}$ crystal, for example. Here, "x" is a real number satisfying $0 \leq x < 1$.

The seed crystal 562 may be formed by CVD using a source gas partially containing halogen. Because the precursor of the seed crystal 562 is inhibited from growing into a crystal on the surface of the inhibition layer 554, the seed crystal 562 is selectively grown inside the opening 556. At this stage, defects such as lattice defect may be included inside the seed crystal 562.

By annealing the seed crystal 562, the defect density inside the seed crystal 562 can be decreased. The annealing for the seed crystal 562 may be the same as the annealing for the seed crystal 140. Accordingly, the defect density of the seed crystal 562 can be decreased, and the seed crystal 562 having excellent crystallinity can be obtained. The average dislocation density of the threading dislocation penetrating up to the surface of the seed crystal 562 is desirably reduced to $10^5$ $cm^{-2}$ or below. The average dislocation density can be measured by an etch-pit method or a plan-view cross-sectional observation using a transmission electron microscope.

As shown in FIG. 9, the precursor layer 964 is disposed in contact with the seed crystal 562. The precursor layer 964 has a resistivity that increases as the precursor layer 964 is oxidized, thereby electrically separating the base wafer 520 from the compound semiconductor 566. That is, the precursor layer 964 functions as the high resistance layer 564, by being oxidized. For example, the precursor layer 964 is a group III-V compound semiconductor containing Al. The precursor layer 964 may be AlGaAs or AlInGaP. In these precursors including Al, the percentage of the Al component in the Ga component in the group III element component is preferably equal to or greater than 40%, and more preferably equal to or greater than 60%. The precursor layer 964 may be formed by an epitaxial growth method such as MOCVD.

Figure 10:
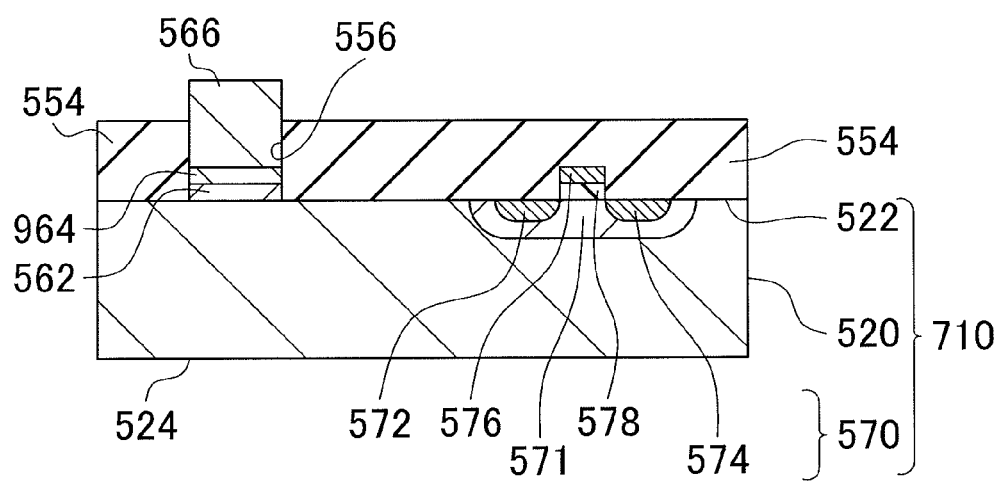
FIG. 10 schematically shows an example of a semiconductor wafer 1010.

FIG. 10 schematically shows an example of a cross section of a semiconductor wafer 1010. S612 of FIG. 6 is explained as follows, with reference to FIG. 10. As shown in FIG. 10, the compound semiconductor 566 lattice matching or pseudo lattice matching the seed crystal 562 is formed to be in contact with the precursor layer 964. In other words, both of the seed crystal 562 and the compound semiconductor 566 lattice match or pseudo lattice match the precursor layer 964, and so the seed crystal 562 also lattice matches or pseudo lattice matches the compound semiconductor 566.

For example, the compound semiconductor 566 is a crystal of a group III-V compound semiconductor such as GaAs. The compound semiconductor 566 may be formed by an epitaxial growth method such as MOCVD. The precursor layer 964 can function as the high resistance layer 564 by selectively oxidizing the precursor layer 964 after crystal growth of the compound semiconductor 566.

Figure 11:
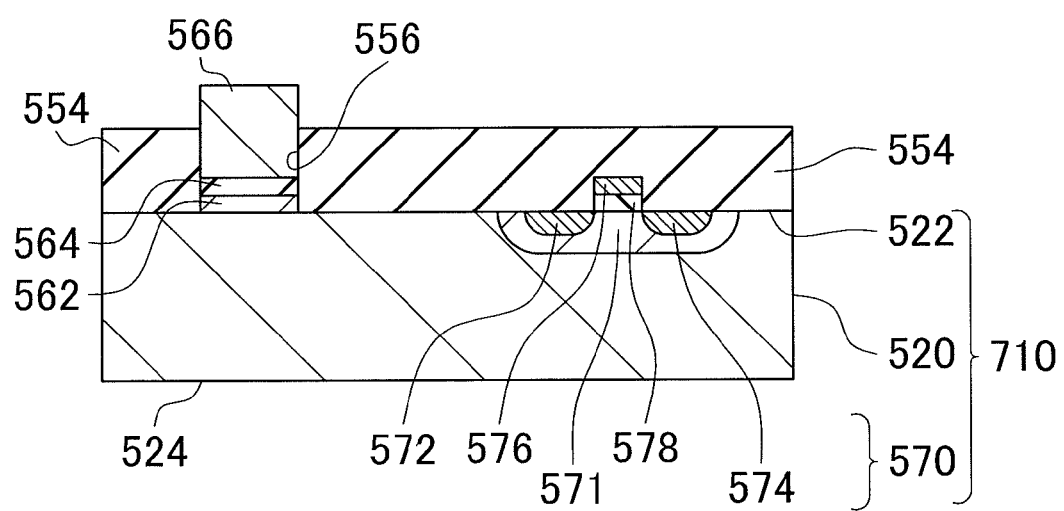
FIG. 11 schematically shows an example of a cross section of a semiconductor wafer 510.

FIG. 11 schematically shows an example of a cross section of a semiconductor wafer 510. S614 of FIG. 6 is explained as follows, with reference to FIG. 11. As shown in FIG. 11, the precursor layer 964 is selectively oxidized, thereby forming the high resistance layer 564. The precursor layer 964 has a resistivity that increases as the precursor layer 964 is oxidized. The high resistance layer 564 thereby electrically separates the seed crystal 562 from the compound semiconductor 566. As a result, the compound semiconductor 566 is electrically separated from the base wafer 520, thereby stabilizing the operation of the second electronic element 580 formed on the compound semiconductor 566 and the first electronic element 570 formed on the base wafer 520.

The precursor layer 964 is selectively oxidized by performing a thermal process on the semiconductor wafer 1010 under the oxygen atmosphere, for example. The precursor layer 964 is selectively oxidized by the following procedure, for example. First, the semiconductor wafer 1010 including the precursor layer 964 is placed on the heating support member installed in the reaction chamber, and the semiconductor wafer 1010 is pre-heated to about 500 degrees centigrade. The pressure in the reaction chamber is set to be 100 kPa for example, and an inert gas such as argon gas is supplied as a carrier gas. Besides the argon gas, a rare gas such as helium and neon, nitrogen, and hydrogen can also be used as the carrier gas, depending on the type of the precursor.

Next, the argon gas in which water is incorporated by aeration through the water chamber maintained to 25 degrees centigrade is supplied in the flow rate of 500 cc/minute as the carrier gas, for example. The precursor layer 964 can be selectively oxidized by processing the semiconductor wafer 1010 by means of the water added to the carrier gas. In the above-explained processing, the vapor partial pressure and the processing duration determined by the wafer temperature, the water chamber temperature, and the aeration amount can be adjusted by the composition, the thickness, and the processed area of the precursor layer 964, as appropriate.

A void may be formed between the precursor layer 964 and the inner wall of the opening 556. In such a case, by subjecting the semiconductor wafer 1010 to a thermal process under the oxygen atmosphere, oxygen is introduced through the plane of the precursor layer 964 in contact with the void, so as to selectively oxidize the precursor layer 964.

Figure 12:
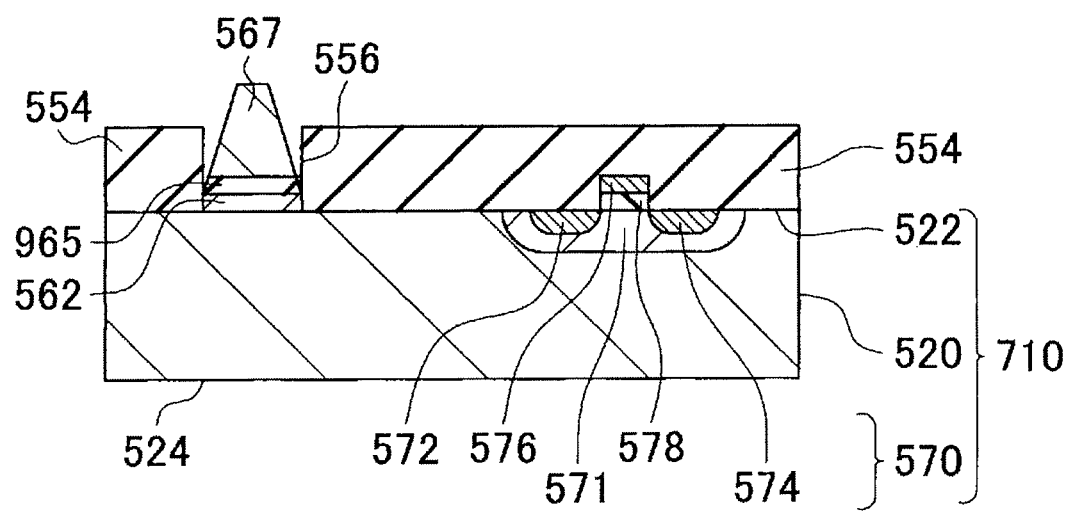
FIG. 12 schematically shows an example of the semiconductor wafer 1010.

FIG. 12 schematically shows an example of the semiconductor wafer 1010. In the semiconductor wafer 1010 in this drawing, the shape of the precursor layer 965 and the shape of the compound semiconductor 567 are different from their counterparts of the semiconductor wafer 1010 of FIG. 10. The precursor layer 965 is formed of a material that is equivalent to the material of the precursor layer 964. The compound semiconductor 567 is formed of a material that is equivalent to the material of the compound semiconductor 566.

The precursor layer 965 is not in contact with the inner wall of the opening 556. In other words, there is a void formed between the precursor layer 965 and the inner wall of the opening 556. Therefore, when the semiconductor wafer 1010 is introduced in the oxygen atmosphere, oxygen is introduced through the plane of the precursor layer 965 in contact with the void, which makes it easy to selectively oxidize the precursor layer 965.

EMBODIMENT EXAMPLES

Embodiment Example 1

An electronic device 500 was fabricated according to the procedure shown in FIG. 6. A commercially-available SOI wafer was prepared as the base wafer 520. As a first electronic element 570, a MOSFET was formed on the Si crystal layer of the base wafer 520. The wafer 710 was prepared in this way. As an inhibition layer 554, a $SiO_2$ layer was formed by CVD to be in contact with the first main plane 522 of the base wafer 520. The average thickness of the $SiO_2$ layer was 1 μm. An opening 556 was formed through a part of the inhibition layer 554 by lithography. The size of the opening 556 was set to be 15 μm×15 μm.

Thus formed wafer 710 was placed inside the reaction chamber, and a Ge crystal layer was formed as a seed crystal 562. The Ge crystal layer was selectively formed inside the opening 556 by CVD. The Ge crystal layer is formed by first depositing about 20 nm under a condition of the source gas being GeH4, the pressure in the reaction chamber being 2.6 kPa, and the growth temperature being 400 degrees centigrade, and subsequently raising the temperature to 600 degrees centigrade to continue deposition to the thickness of about 1 μm.

Next, the Ge crystal layer was annealed in the reaction chamber. In the annealing process, after performing first annealing at 850 degrees centigrade for 10 minutes, the subsequent annealing was performed at 780 degrees centigrade for 10 minutes. After forming the Ge crystal layer, the annealing process was performed without any need to take out the wafer 710 from the reaction chamber. In other words, in the present embodiment example, the Ge crystal layer was annealed right after the step of growing the precursor of the Ge crystal into a crystal, without subjecting the Ge crystal layer to the atmospheric pressure between these two steps. Moreover, the step of forming the Ge crystal layer by crystal growth and the step of annealing the Ge crystal layer were performed in the same reaction chamber.

After annealing the Ge crystal layer, an AlGaAs layer was formed by MOCVD, as a precursor layer 964. The AlGaAs layer was deposited under a condition of the source gas being trimethyl aluminum, trimethyl gallium, and arsine, the deposition temperature being 620 degrees centigrade, and the pressure in the reaction chamber being 9.9 kPa. The AlGaAs layer was grown inside the opening 556, using as a seed plane, the plane exposing from the opening 556 of the Ge Crystal layer 556. The Al composition adopted in this process was 0.8 with respect to the total of Al and Ga.

A GaAs layer was formed by MOCVD, as the compound semiconductor 566. The GaAs layer was deposited under a condition of the source gas being trimethyl gallium and arsine, the deposition temperature being 650 degrees centigrade, and the pressure in the reaction chamber being 9.9 kPa. The GaAs layer was grown, using a specific plane of the AlGaAs layer, as a seed plane. The GaAs layer was grown to protrude from the surface of the inhibition layer 554. The semiconductor wafer 1010 was thus completed.

The temperature and the pressure of the reaction chamber, in which the semiconductor wafer 1010 was placed, were set to 500 degrees centigrade and 100 kPa respectively, and the argon gas after aeration through the water chamber maintained to 25 degrees centigrade was supplied to this reaction chamber at a flow rate of 500 cc/minute. The AlGaAs layer was selectively oxidized by processing the semiconductor wafer 1010 under the above-stated condition for about 15 minutes. As a result, the AlGaAs layer was oxidized to become a high resistance layer 564 being an oxide dielectric, to result the semiconductor wafer 510. The semiconductor wafer 510 was thus completed.

An HBT including the GaAs layer as an active layer was formed on the compound semiconductor 566 of the obtained semiconductor wafer 510, as the second electronic element 580. Following this, the interconnection was formed to complete the electronic device 500. An operation test was conducted to this electronic device 500. The result shows a current gain of 176 in the collector current density of 1 kA/$cm^2$, which proves that the electronic device 500 normally operates as a current amplifying element. In addition, a threshold and a current voltage characteristic comparable to the initial characteristics were confirmed for the MOSFET formed as the first electronic element 570 on the Si crystal layer of the base wafer 520. The leak current between the collector electrodes in the plurality of HBTs respectively formed in the openings adjacent to each other was observed to be extremely low ($2.5 \times 10^{-10}$ A on average for 10V applied voltage).

The Ge crystal layer after annealing was observed by the SEM. The result shows that the thickness of the Ge crystal layer is about 1 μm and the thickness of the GaAs layer was 2.5 µm, both conforming to the design values. The result of examination of the surface of the GaAs layer using the etch-pit method, no defect was found on the surface of the GaAs layer. Moreover, the in-plane cross-sectional observation using the TEM found no dislocation penetrating from the Ge crystal layer to the GaAs layer. As clear from the above, obtained are a semiconductor wafer and an electronic device that include a compound semiconductor having excellent crystallinity, and in which the wafer is electrically insulated from the compound semiconductor formed on the wafer.

Embodiment Example 2

A semiconductor wafer 510 was fabricated just as in Embodiment Example 1, except that an AlGaAs layer that has an Al composition of 0.3 with respect to the total of Al and Ga and that includes oxygen in an atomic concentration of about $5 \times 10^{19}/cm^3$ was used as the high resistance layer 564, instead of using the selectively oxidized AlGaAs layer. Dibutyl ether was used as the oxygen source. The dibutyl ether was obtained by adding, to the source gas, hydrogen aerated through the dibutyl ether liquid maintained to 25 degrees centigrade in a flow rate of 200 cc/minute, and supplied during the crystal growth of the AlGaAs layer. The above-described oxygen concentration was achieved in this method. The other procedures are the same as adopted in Embodiment Example 1.

The leak current between the collector electrodes in the plurality of HBTs respectively formed in the openings adjacent to each other was observed to be extremely low ($1.3 \times 10^{-8}$ A on average for 10V applied voltage). As clear from the above, obtained are a semiconductor wafer and an electronic device that include a compound semiconductor having excellent crystallinity, and in which the wafer is electrically insulated from the compound semiconductor formed on the wafer.

Embodiment Example 3

A semiconductor wafer 510 was fabricated just as in Embodiment Example 1, except that an InGaP layer that includes boron in an atomic concentration of about $2 \times 10^{20}/cm^3$ was used as the high resistance layer 564, instead of using the selectively oxidized AlGaAs layer. Trimethyl boron was used as the boron source. The trimethyl boron was obtained by adding, to the source gas, hydrogen aerated through the trimethyl boron liquid maintained to 10 degrees centigrade in a flow rate of 10 cc/minute, and supplied during the crystal growth of the InGaP layer. The above-described boron concentration was achieved in this method. The other procedures are the same as adopted in Embodiment Example 1.

The leak current between the collector electrodes in the plurality of HBTs respectively formed in the openings adjacent to each other was observed to be extremely low ($2.7 \times 10^{-9}$ A on average for 10V applied voltage). As clear from the above, obtained are a semiconductor wafer and an electronic device that include a compound semiconductor having excellent crystallinity, and in which the wafer is electrically insulated from the compound semiconductor formed on the wafer.

Embodiment Example 4

A semiconductor wafer 510 was fabricated just as in Embodiment Example 2, except that an AlGaAs layer that has an Al composition of 0.3 with respect to the total of Al and Ga and that includes oxygen in an atomic concentration of about $2 \times 10^{19}/cm^3$ was used as the high resistance layer 564. Based on the obtained semiconductor wafer 510, an electronic device 500 was fabricated just as in Embodiment Example 2. An operation test was conducted to this electronic device 500. The result shows a current gain of 123 in the collector current density of 1 kA/cm².

Figure 13:
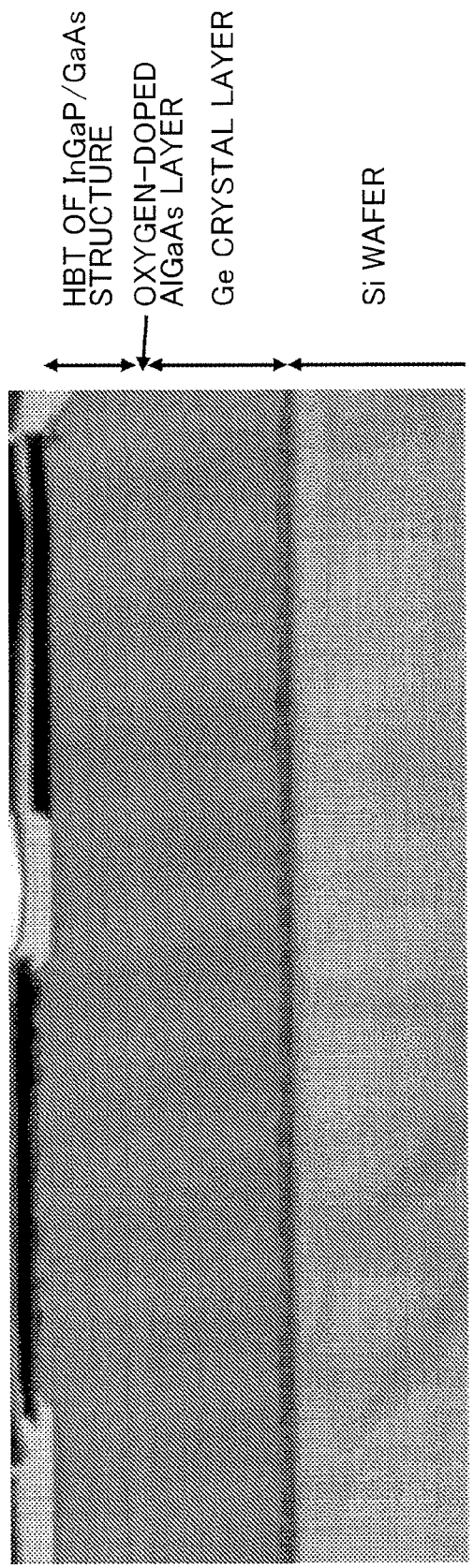
FIG. 13 is a cross-section TEM image obtained by observing a portion of the electronic device 500 in which an HBT is formed.

The leak current between the collector electrodes in the plurality of HBTs respectively formed in the openings adjacent to each other was observed to be extremely low ($3.8 \times 10^{-9}$ A on average for 10V applied voltage). FIG. 13 is a cross-section TEM image obtained by observing a portion of the electronic device 500 in which an HBT is formed. A Ge crystal is formed on the Si wafer, on which an oxygen-doped AlGaAs layer is further formed. On the oxygen-doped AlGaAs layer, an HBT having an InGaP/GaAs structure is formed. FIG. 13 proves that the formed Ge crystal and InGaP/GaAs layer are favorable, and no dislocation penetrating from the Ge crystal layer to the InGaP/GaAs layer is found.

Comparison Example 1

A semiconductor wafer 1010 was fabricated just as in Embodiment Example 1, except that the precursor layer 964 is not formed and a compound semiconductor layer is formed on the Ge crystal layer. On the obtained semiconductor wafer 1010, an electronic device was fabricated just as in Embodiment Example 1.

The leak current between the collector electrodes in the plurality of HBTs respectively formed in the openings adjacent to each other was observed to be $1.8 \times 10^{-6}$ A on average for 10V applied voltage. This leak current is $7.2 \times 10^2$ times the value of Embodiment Example 1, $1.4 \times 10^2$ times the value of Embodiment Example 2, and $6.7 \times 10^2$ times the value of Embodiment Example 3.

This shows the high resistance layer 564 helps obtain a semiconductor wafer 510 and an electronic device 500 that include a compound semiconductor 566 having excellent crystallinity, and in which the base wafer 520 is electrically insulated from the compound semiconductor 566 formed on the base wafer 520.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

DESCRIPTION OF REFERENCE NUMERALS 110 semiconductor wafer
120 base wafer
122 first main plane
124 second main plane
140 seed crystals
160 high resistance layer
180 compound semiconductor
210 semiconductor wafer 250 inhibition layer
256 opening
302 front plane
310 rear plane
320 GOI wafer
322 wafer
324 dielectric
326 $Si_xGe_{1-x}$ crystal layer
410 semiconductor wafer
460 separation section
480 compound semiconductor
500 electronic device
510 semiconductor wafer
520 base wafer
522 first main plane
524 second main plane
554 inhibition layer
556 opening
562 seed crystals
564 high resistance layer
566 compound semiconductor
567 compound semiconductor
570 first electronic element
571 well
572 source region
574 drain region
576 gate electrode
578 gate insulating film
580 second electronic element
587 input/output electrode
588 input/output electrode
589 gate electrode
592 interconnection
593 opening
594 interconnection
595 opening
596 interconnection
710 wafer
964 precursor layer
965 precursor layer
1010 semiconductor wafer

The invention claimed is:

1. A semiconductor wafer comprising:
a base wafer;
a seed crystal disposed on the base wafer;
a compound semiconductor disposed above the seed crystal;
a high resistance layer disposed between the seed crystal and the compound semiconductor, the high resistance layer having a larger resistivity than the seed crystal; and
an inhibition layer that has been formed on the base wafer and inhibits a precursor of the seed crystal from growing into a crystal,
wherein an opening penetrating the inhibition layer to the base wafer has been formed, the seed crystal has been disposed inside the opening, and the seed crystal lattice matches or pseudo lattice matches the compound semiconductor.

2. The semiconductor wafer according to claim 1, wherein the base wafer is a Si wafer, a SOI wafer, or a GOI wafer.

3. The semiconductor wafer according to claim 1, wherein the high resistance layer comprises an oxide dielectric.

4. The semiconductor wafer according to claim 3, wherein the oxide dielectric has been formed by selectively oxidizing a part of the compound semiconductor.

5. The semiconductor wafer according to claim 4, wherein the oxide dielectric has been formed by oxidizing a group III-V compound semiconductor containing Al.

6. The semiconductor wafer according to claim 1, wherein the high resistance layer comprises a group III-V compound semiconductor containing B or an oxygen-doped group III-V compound semiconductor containing Al.

7. The semiconductor wafer according to claim 1, manufactured by:
disposing the seed crystal on the base wafer;
forming, by crystal growth, a precursor layer lattice matching or pseudo lattice matching the seed crystal;
forming, by crystal growth, the compound semiconductor lattice matching or pseudo lattice matching the precursor layer; and
forming the high resistance layer by selectively oxidizing the precursor layer.

8. A semiconductor wafer comprising:
a base wafer;
a seed crystal disposed on the base wafer;
a compound semiconductor disposed above the seed crystal; and
a high resistance layer disposed between the seed crystal and the compound semiconductor, the high resistance layer having a larger resistivity than the seed crystal,
wherein the seed crystal comprises $Si_xGe_{1-x}$ crystal ($0 \le x < 1$), and the seed crystal lattice matches or pseudo lattice matches the compound semiconductor.

9. A semiconductor wafer comprising:
a seed crystal disposed on the base wafer;
a compound semiconductor disposed above the seed crystal; and
a high resistance layer disposed between the seed crystal and the compound semiconductor, the high resistance layer having a larger resistivity than the seed crystal,
wherein the seed crystal is a p-type semiconductor, the compound semiconductor is an n-type semiconductor, the high resistance layer is a depletion layer of the compound semiconductor, and the seed crystal lattice matches or pseudo lattice matches the compound semiconductor.

10. The semiconductor wafer according to claim 9, wherein the seed crystal is high-concentration p-type Ge, and the compound semiconductor is low-concentration n-type $Al_yGa_{1-y}As$ ($0 \le y \le 1$).

11. The semiconductor wafer according to claim 9, wherein the seed crystal is low-concentration p-type SiGe, and the compound semiconductor is low-concentration n-type $In_zGa_{1-z}P$ ($0 \le z \le 1$).

12. A semiconductor wafer comprising:
a base wafer;
a seed crystal disposed on the base wafer;
a compound semiconductor disposed above the seed crystal;
a high resistance layer disposed between the seed crystal and the compound semiconductor, the high resistance layer having a larger resistivity than the seed crystal; and
an inhibition layer that has been formed on the base wafer and inhibits a precursor of the seed crystal from growing into a crystal,
wherein an opening penetrating the inhibition layer to the base wafer has been formed, the seed crystal has been disposed inside the opening, the seed crystal lattice matches or pseudo lattice matches the compound semiconductor, the seed crystal comprises a $Si_xGe_{1-x}$ crystal ($0 \le x < 1$), and the precursor layer comprises a group III-V compound semiconductor containing Al, and wherein the semiconductor wafer is manufactured by:

disposing the seed crystal on the base wafer;

forming, by crystal growth, a precursor layer lattice matching or pseudo lattice matching the seed crystal;

forming, by crystal growth, the compound semiconductor lattice matching or pseudo lattice matching the precursor layer; and forming the high resistance layer by selectively oxidizing the precursor layer.

13. A semiconductor wafer comprising:

a base wafer;

a seed crystal disposed on the base wafer;

a compound semiconductor disposed above the seed crystal; and a high resistance layer disposed between the seed crystal and the compound semiconductor, the high resistance layer having a larger resistivity than the seed crystal, wherein the seed crystal lattice matches or pseudo lattice matches the compound semiconductor, and wherein the semiconductor wafer is manufactured by:

forming, on the base wafer, an inhibition layer that inhibits a precursor of the seed crystal from growing into a crystal;

forming, in the inhibition layer, an opening penetrating the inhibition layer to the base wafer;

providing the seed crystal inside the opening;

forming, by crystal growth, a precursor layer lattice matching or pseudo lattice matching the seed crystal;

forming, by crystal growth, the compound semiconductor lattice matching or pseudo lattice matching the precursor layer; and forming the high resistance layer by selectively oxidizing the precursor layer.

14. The semiconductor wafer according to claim 13, wherein a void has been formed between the precursor layer and an inner wall of the opening, and the semiconductor wafer has been manufactured by:

introducing oxygen through a plane of the precursor layer in contact with the void, thereby selectively oxidizing the precursor layer.

15. The semiconductor wafer according to claim 13, manufactured by:

forming, by crystal growth, the precursor layer to protrude from a surface of the inhibition layer;

forming, by crystal growth, the compound semiconductor along the inhibition layer using the precursor layer as a nucleus; and selectively oxidizing the precursor layer.

16. An electronic device comprising:

a base wafer;

a seed crystal disposed on the base wafer;

a compound semiconductor disposed above the seed crystal;

a high resistance layer disposed between the seed crystal and the compound semiconductor, the high resistance layer having a larger resistivity than the seed crystal;

a first electronic element formed in the compound semiconductor; and an inhibition layer that has been formed on the base wafer and inhibits a precursor of the seed crystal from growing into a crystal, wherein an opening penetrating the inhibition layer to the base wafer has been formed in the inhibition layer, the seed crystal has been formed inside the opening, and the seed crystal lattice matches or pseudo lattice matches the compound semiconductor.

17. The electronic device according to claim 16, further comprising:

a second electronic element formed on the base wafer, wherein the inhibition layer has been formed above the second electronic element.

18. The electronic device according to claim 16, wherein the high resistance layer has been formed by selectively oxidizing a part of the compound semiconductor.

* * * * *